United States Patent [19]

Kekura

[11] Patent Number: 5,132,769
[45] Date of Patent: Jul. 21, 1992

[54] SEMICONDUCTOR DEVICE WITH HIGH WITHSTAND VOLTAGE

[75] Inventor: Mitsuru Kekura, Shizuoka, Japan

[73] Assignee: Kabushiki Kaisha Meidensha, Tokyo, Japan

[21] Appl. No.: 368,773

[22] Filed: Jun. 20, 1989

[30] Foreign Application Priority Data

Jun. 20, 1988 [JP] Japan .................. 63-151501

[51] Int. Cl.$^5$ .......................... H01L 29/06
[52] U.S. Cl. ........................ 357/55; 357/13; 357/53; 357/38; 357/39; 357/20; 357/12
[58] Field of Search .......... 357/38, 53, 13, 39, 357/55, 12, 20

[56] References Cited

U.S. PATENT DOCUMENTS 4,236,169 11/1980 Nakashima et al. .............. 357/38
4,642,669 2/1987 Roggwiller et al. .............. 357/38

FOREIGN PATENT DOCUMENTS 6614367 4/1967 Netherlands .................. 357/380
1091656 11/1967 United Kingdom .............. 357/38

Primary Examiner—Rolf Hille
Assistant Examiner—Steven Loke
Attorney, Agent, or Firm—Bachman & LaPointe

[57] ABSTRACT

A semiconductor device has PN junction in architecture of PN$^-$N$^+$, P$^+$NN$^+$, PIN, or P$\gamma$N. Such semiconductor device comprises a first surface layer dopped with a first type impurity at a predetermined first concentration for forming a high resistant layer, a second layer formed below the first layer and dopped with a second type impurity which is different from the first impurity at a predetermined limited second concentration, the second layer forming PN junction between the first layer, and a third layer formed below the second layer and dopped with the second impurity at a predetermined third concentration higher than the second concentration. The semiconductor device also has a first edge section extending over the first layer and the second layer and formed into a first Bevel structure having a first taper angle, and a second edge section extending over the second and third layer so as to adjoin with the first edge section at an intersection oriented at a portion in the second layer and formed into a second Bevel structure having a second taper angle.

6 Claims, 5 Drawing Sheets

SEMICONDUCTOR DEVICE WITH HIGH WITHSTAND VOLTAGE

BACKGROUND OF THE INVENTION

1. Field of the Invention

The present invention relates generally to a semiconductor device which has enhanced withstand voltage property. More particularly, the invention relates to a structure of a semiconductor device having PN junction with improved withstand voltage.

2. Description of the Background Art

For semiconductor devices, such as semiconductor diode, gate turn-OFF thyristor and sop forth, it is essential to weaken electric field of surface of PN junction so as to maintain withstand voltage at high level and to prevent the device from causing avalanche at relatively low voltage. In order to weaken the electric field at the PN junction surface, Bevel structure is generally employed by providing taper for the surface to which the end of the junction is exposed. There is two way of providing Bevel structure for the surface. One way is to form a positive Bevel structure, in which cross section is gradually increased from the upper high resistant layer which has relatively low concentration of dopped N-type impurity to the lower low resistance layer which has relatively high concentration of dopped p-type impurity. The other way is to form a negative Bevel structure, in which cross section is gradually decreased from the upper high resistant layer to the lower low resistant layer.

In the recent years, there have been proposed improved constructions of semiconductor devices which has lower ON voltage. Such recently proposed semiconductor devices has architecture of PN−N+, P+NN+, PIN, PγN and so forth. In the PN−N+ architecture, N-type high resistant layer is separated into N− layer which has low N-type impurity concentration and N+ layer which has high N-type impurity concentration. The PN−N+ architecture has been advantageously employed in the modern semiconductor devices because it achieves lower. ON voltage by reducing width of N−N+ layer by terminating depletion region with the N+ layer For such modernized semiconductor devices, the positive and negative Bevel structures are not effective for reducing strength of the surface electric field. Therefore, such conventionally known Bevel structure is not applicable of the modernized semiconductor devices such as that set forth above. Namely, when the positive Bevel structure is employed for PN−N+ architecture semiconductor device, electric field concentrates to the N+ layer to cause lowering of the withstand voltage. For improving this, various attempts have been made. In one approach, different taper angle of negative Bevel structure is provided. In the prior proposed architecture, P and N− layers are provided at smaller taper angle with respect to the vertical axis than that of the N+ layer. On the other hand, it is possible to provide positive and negative Bevel respectively for P layer and N+ layer. In either case, configuration of the semiconductor devices become complete to cause difficult in processing to form desired Bevels. Also, the complicate configuration causes difficulty in forming dust proof and/or shielding layer with polyimide or silicon rubber. In addition, such prior proposed structure requires process of relatively wide area to cause reduction of the effective area.

SUMMARY OF THE INVENTION

Therefore, it is an object of the present invention to provide a semiconductor device which can solve the problems set forth above.

Another object of the present invention is to provide a semiconductor device which has satisfactorily high withstand voltage and with construction to be easily processed.

According to one aspect of the invention, a semiconductor device having PN junction, comprises:

a first surface layer dopped with a first type impurity at a predetermined first concentration for forming a high resistant layer;

a second layer formed below the first layer and dopped with a second type impurity which is different from the first impurity at a predetermined limited second concentration, the second layer forming PN junction between the first layer;

a third layer formed below the second layer and dopped with the second impurity at a predetermined third concentration higher than the second concentration;

a first edge section extending over the first layer and the second layer and formed into a first Bevel structure having a first taper angle; and a second edge section extending over the second and third layer so as to adjoin with the first edge section at an intersection oriented at a portion in the second layer and formed into a second Bevel structure having a second taper angle.

The first taper angle may be in a range of 0°±15° with respect to a vertical plane. The second taper angle may be in a range of 40°±20° with respect to a vertical plane. Further preferably, the orientation of the intersection is determined at a position distanced from the PN junction in a range of 80% to 100% versus thickness of the second layer.

According to another aspect of the invention, a process for fabricating a semiconductor device comprises the steps of:

preparing a semiconductor wafer having a first surface layer dopped with a first type impurity at a predetermined first concentration for forming a high resistant layer;

a second layer formed below the first layer and dopped with a second type impurity which is different from the first impurity at a predetermined limited second concentration, the second layer forming PN junction between the first layer;

a third layer formed below the second layer and dopped with the second impurity at a predetermined third concentration higher than the second concentration;

processing a first edge section extending over the first layer and the second layer for forming a first Bevel structure having a first taper angle; and processing a second edge section extending over the second and third layer so as to adjoin with the first edge section at an intersection oriented at a portion in the second layer for formed into a second Bevel structure having a second taper angle.

Preferably, the step for processing the first edge section is performed for providing the first taper angle in a range of 0°±15° with respect to a vertical plane. The process the step for processing the first edge section may be performed for providing the second taper angle in a range of 40°±20° with respect to a vertical plane. Also, the orientation of the intersection is determined at a position distanced from the PN junction in a range of 80% to 100% versus thickness of the second layer.

The steps of processing the first and second edges is practically performed by sand blasting. The sand blasting may be performed by tilting a blasting nozzle at an angle of 5°±3° with respect to the vertical plane.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
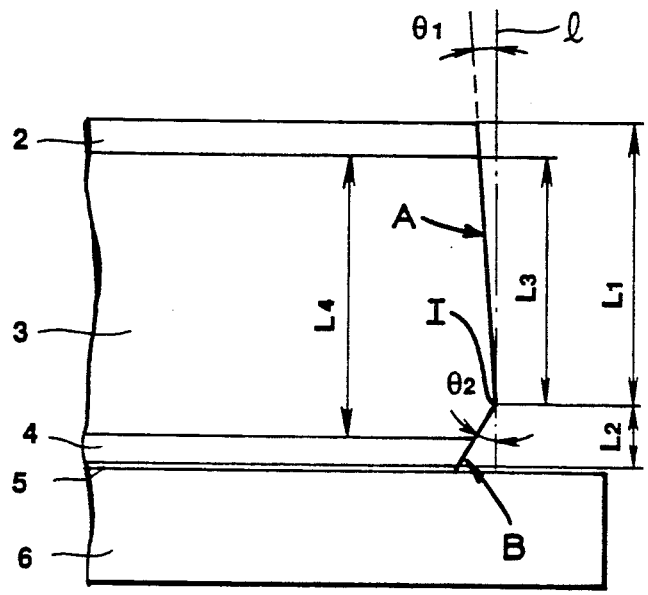
FIG. 1 is a section of the preferred embodiment of a semiconductor device according to the present invention.

Referring now to the drawings, particularly to FIG. 1, the preferred embodiment of a semiconductor device, according to the present invention, will be discussed herebelow in terms of the semiconductor device employing PN$^-$N$^+$ architecture. As seen from FIG. 1, the shown embodiment of the semiconductor device is fabricated with P-type layer 2, N$^-$-type layer 3 and N$^+$-type layer 4. As discussed in the introduction of the disclosure, the P-type layer 2 is formed on the surface of the semiconductor device and dopped with P-type impurity. The concentration of P-type impurity dopped in the P-type layer 2 is relatively low to form high resistant layer. The N$^-$-type layer 3 is formed below the P-type layer 2 and is dopped with N-type impurity at relatively low concentration. The N$^+$-type layer 4 is formed below the N$^-$-type layer 3. The N$^+$-type layer 4 is dopped with N-type impurity at relatively high concentration. The N$^+$-type 1 layer 4 forms a high resistant layer together with the N$^-$ type layer 3. The N$^+$-type layer 4 is bonded on a reinforcement 6 by brazing material 5.

The semiconductor device has a first Bevel processed section A and a second Bevel processed section B. The first and second Bevel processed sections A and B are adjoining to each other at an intersection I. In the preferred embodiment, the intersection I is oriented at a position distanced from the surface at $L_1$ and from the bottom at $L_2$. Furthermore, the orientation of the intersection I is set in the N$^-$-type layer. The distance from the PN junction between the P-type layer and the N$^-$-type layer is set at $L_3$ which is approximately 4/5 of the overall thickness $L_4$ of the N$^-$-type layer.

The first Bevel processed section A has taper angle $\theta_1$ with respect to the vertical axis 1 in a range of 0°±15°. On the other hand, the second Bevel processed section B is provided negative Bevel with a taper angle $\theta_2$ with respect to the vertical axis 1 in a range of 40°±20°.

Figure 3:
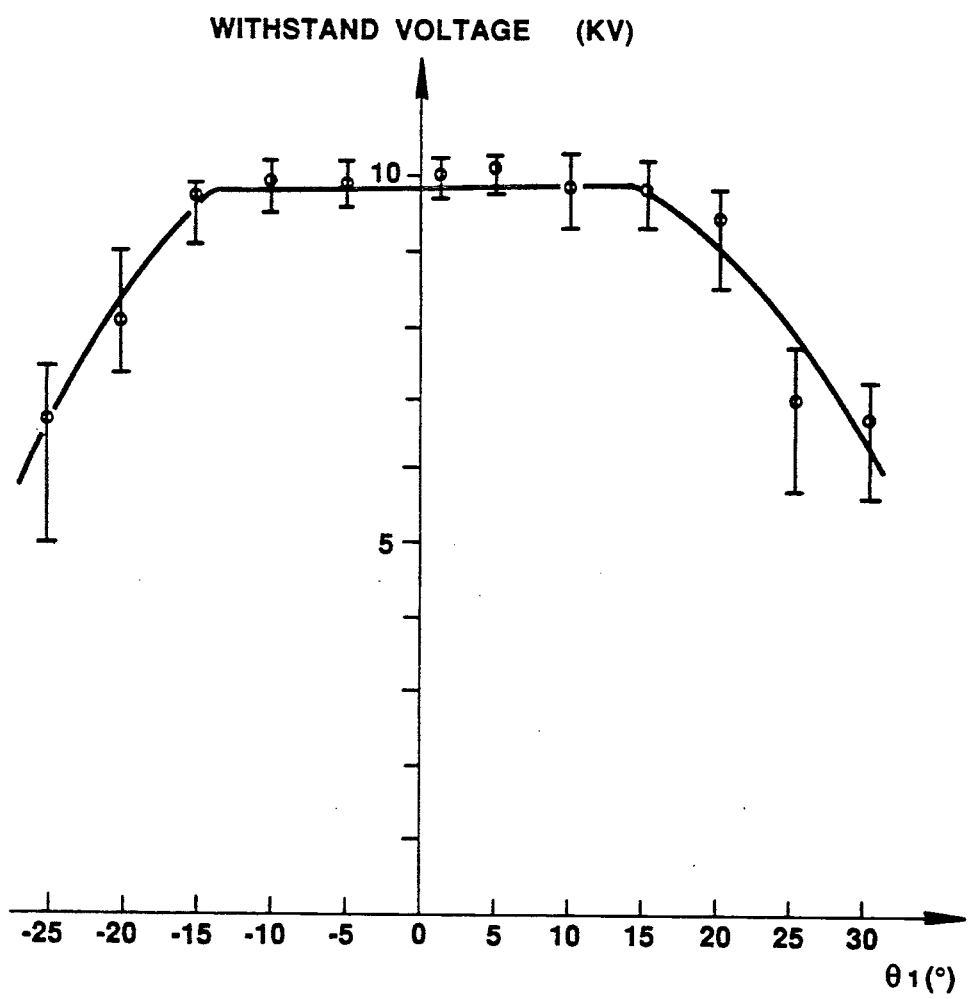
FIG. 3 is a graph showing variation of withstand voltage depending upon a taper angle $\theta_1$ of the Bevel structure in the preferred embodiment of the semiconductor device.
Figure 4:
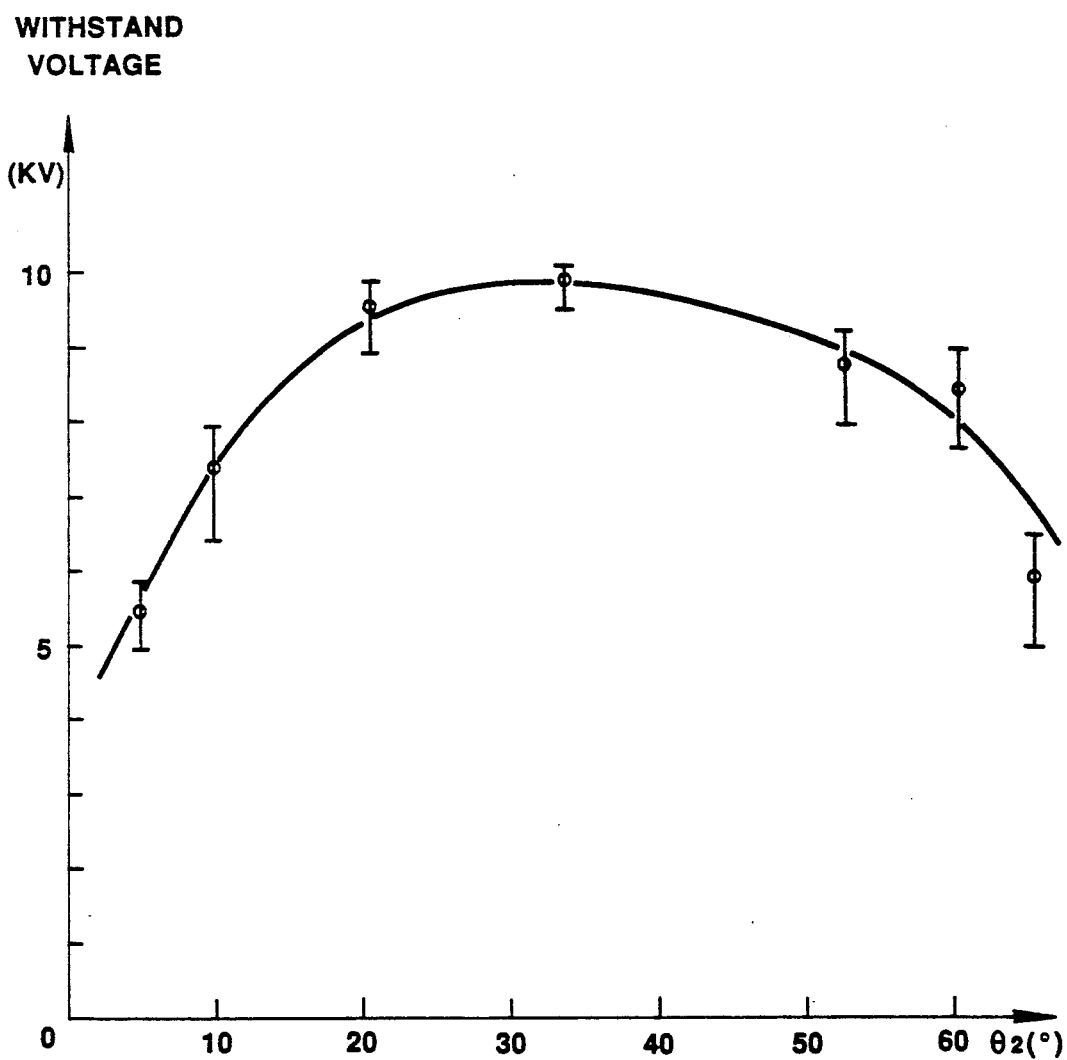
FIG. 4 is a graph showing variation of withstand voltage depending upon a taper angle $\theta_2$ of the Bevel structure in the preferred embodiment of the semiconductor device.

The taper angles $\theta_1$ and $\theta_2$ are selected through experiments. Experimentally measured withstand voltage relative to the taper angles $\theta_1$ and $\theta_2$ are shown in FIGS. 3 and 4. FIG. 3 shows results of experiments performed with fixing the taper angle $\theta_2$ of the second Bevel processed section B at 40° and with varying the taper angle $\theta_1$ of the first Bevel processed section A within a range of $-25°$ to $+30°$. On the other hand, FIG. 4 shows results of experiments performed with fixing the taper angle $\theta_1$ of the first Bevel processed section A at 3° and with varying the taper angle $\theta_2$ within a range of 0° to 80°. As can be seen from FIG. 4, when the taper angle $\theta_2$ is fixed at 40°, the withstand voltage becomes maximum in a range approximately $-15°$ to $+15°$. From this, the preferred range of the taper angle $\theta_1$ is set in a range of 0°±15°. On the other hand, from FIG. 4, it can be seen that the withstand voltage is maintained about 9 KV at the taper angle $\theta_2$ in a range of 20° to 60 °. Further preferred range of the tape angle $\theta_2$ may be within a range of 20° to 40°.

In the experiments, it was observed that when the negative taper angle of the taper angle $\theta_1$ is smaller than $-15°$, concentration of electric field to the N$^+$-type layer occurred. On the other hand, if the positive tape angle of $\theta_1$ is greater than $+15°$, concentration of the electric field to the N$^+$type layer was not observed. However, the electric field strength in the P-type layer and N$^-$-type layer could not be reduced.

Figure 5:
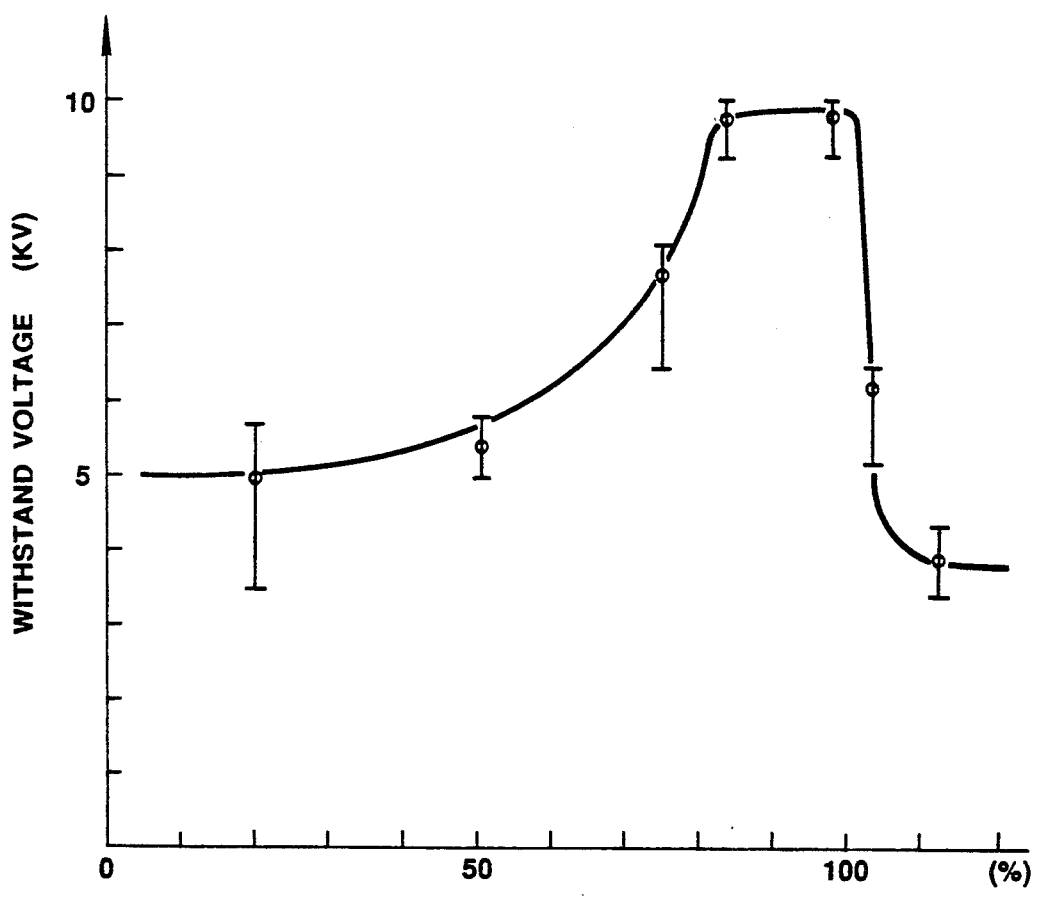
FIG. 5 is a graph showing variation of withstand voltage depending upon variation of the position of the intersection between surfaces having taper angles $\theta_1$ and $\theta_2$.

Further experiments were performed in order to determine the orientation of the intersection I. Results of the additional experiments is shown in FIG. 5. The experiments were performed by fixing taper angles $\theta_1$ and $\theta_2$ respectively within ranges of 0°±15° and 40°±20°. As can be seen from FIG. 5, the withstand voltage becomes maximum when $L_3$ is 80 to 100% of $L_4$. As can be clear herefrom, it is preferred to set the orientation of the intersection I in a position where $L_3/L_4$ is in a range of 80 to 100%. This structure is successfully employed for increasing of the surface area of the N$^+$-type layer exposed to the end for reducing electric field strength.

Figure 2:
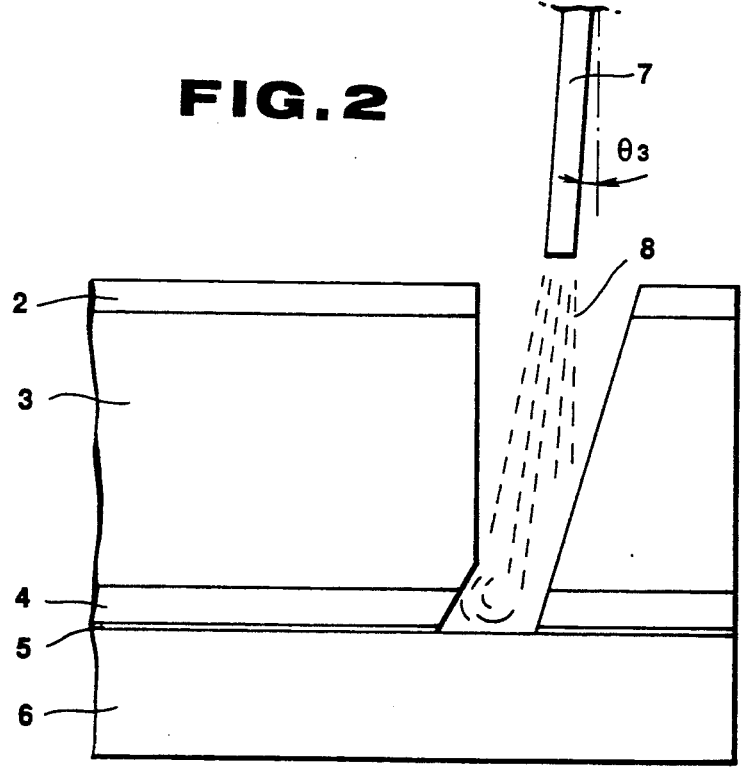
FIG. 2 is a section showing process of forming novel Bevel structure structure employed in the preferred embodiment of the semiconductor device of FIG. 1.

In processing the first and second Bevel processed sections A and B, sand blasting technology may be conveniently utilized. One example of processing of the first and second Bevel processed sections A and B is shown in FIG. 2. In the example of FIG. 2, a sand blasting nozzle 7 is provided with a taper angle $\theta_3$ with respect to the vertical axis 1. The preferred taper angle $\theta_3$ is within a range of 5°±3°. At this nozzle angle, the first Bevel processed section A can be processed. Furthermore, the sand blasted from the nozzle 7 is deflected by the reinforcement 6 to curve the second Bevel processed section B.

Figure 6:
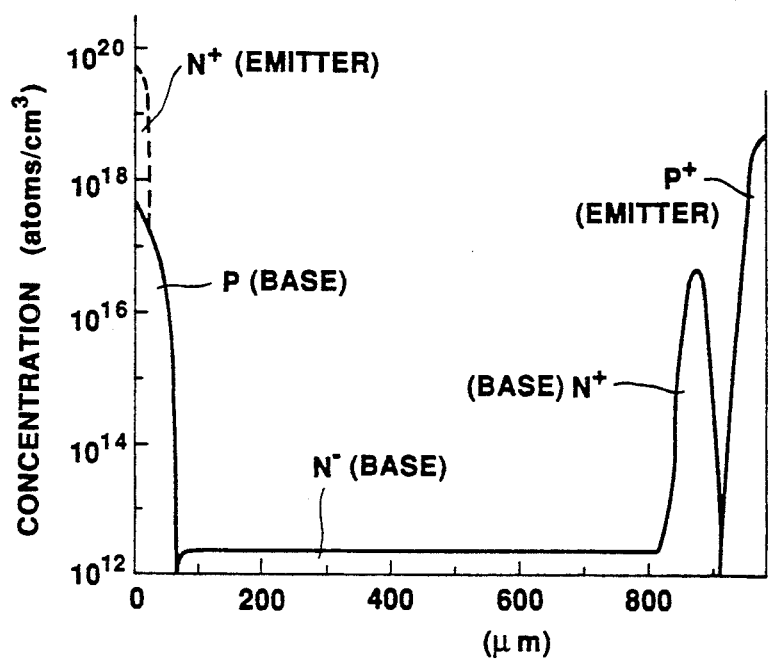
FIG. 6 is a graph showing distribution of impurity concentration in a gate turn-OFF thyristor as one example of practical implementation of the semiconductor device according to the present invention.
Figure 7:
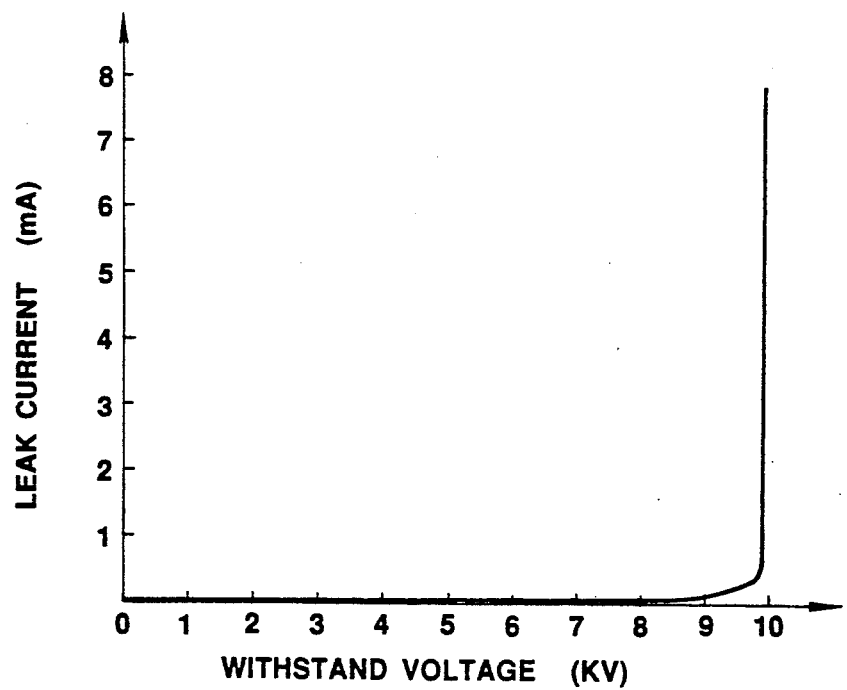
FIG. 7 is a graph showing voltage withstanding characteristics of the preferred embodiment of the gate turn-OFF thyristor of FIG. 6.

In order to demonstrate advantages to be accomplished by the present invention, a gate turn-OFF thyristor was produced utilizing epitaxial and diffusion technologies. Target withstand voltage was set at 9000 V to 10000 V. principle dimension of the produced thyristor is as shown in FIG. 6. Bevel processing was performed by sand blasting with a nozzle angle of 5°. Distortion caused by sand blasting was removed by $HNO_3$—HF type etchant. Polyimide and silicon rubber coating layer was then provided on the surface of the processed thyristor. For this thyristor, withstand voltage test was performed for checking the property of the produced device. The result of the test is shown in FIG. 7. As will be clear from FIG. 7, the produced device achieved the targeted withstand voltage. After testing, the surface coating layer was removed and the cross-section of the wafer was observed. The wafer section shows the configuration substantially conforming the section as illustrated in FIG. 1.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

For example, the shown embodiment is disclosed to perform Bevel process by sand blasting technology, it may be possible to for the Bevel processed sections A and B by various ways. For example, it may be possible to initially form the Bevel processed section in advance of alloy junction with the reinforcement. Subsequently, after alloy junction, the Bevel processed section A can be formed. Furthermore, it should be appreciated that, though the shown embodiment is concentrated to an example of the semiconductor device taking PN−N+ architecture, the same or similar technology of providing Bevel structure is applicable for semiconductor devices having P+NN−, PIN, PγN architecture and so forth.

What is claimed is:

1. A semiconductor device having a PN junction, comprising:
    a first surface layer doped with a first type impurity at a predetermined first concentration for forming a high resistance layer;
    a second layer formed below said first layer and doped with a second type impurity which is different from said first impurity at a predetermined limited second concentration, said second layer having a thickness and forming a PN junction with said first layer;
    a third layer formed below said second layer and doped with said second impurity at a predetermined third concentration higher than said second concentration;
    a first edge section extending over said first layer and said second layer and formed into a first bevel structure having a first taper angle, which first taper angle is so selected in a predetermined angular range as to reduce electrical field strength at the surface of the PN junction;
    a second edge section extending over said second and third layers so as to adjoin with said first edge section at an intersection oriented at a portion in said second layer and formed into a second beveled structure having a second taper angle; and
    said intersection being located at a position distanced from said PN junction at least about 80% of said thickness of said second layer.

2. A semiconductor device as set forth in claim 1, wherein said first taper angle is in a range of 0°±15° with respect to a vertical plane.

3. A semiconductor device as set forth in claim 2, wherein said second taper angle is in a range of 40°±20° with respect to a vertical plane.

4. A semiconductor device as set forth in claim 3, wherein the orientation of said intersection is determined at a position distanced from said PN junction in a range of 80% to 100% versus thickness of said second layer.

5. A semiconductor device as set forth in claim 1, wherein said second taper angle is in a range of 40°±20° with respect to a vertical plane.

6. A semiconductor device as set forth in claim 1, wherein the orientation of said intersection is determined at a position distanced from said PN junction in a range of 80% to 100% versus thickness of said second layer.

* * * * *